(12) United States Patent
Winkler et al.

(10) Patent No.: US 9,145,292 B2
(45) Date of Patent: Sep. 29, 2015

(54) CAVITY STRUCTURES FOR MEMS DEVICES

(71) Applicant: Infineon Technologies AG, Neubiberg (DE)

(72) Inventors: Bernhard Winkler, Regensburg (DE); Andreas Zankl, Wiesent (DE); Klemens Pruegl, Regensburg (DE); Stefan Kolb, Unterschleissheim (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/281,251

(22) Filed: May 19, 2014

(65) Prior Publication Data

US 2014/0252422 A1    Sep. 11, 2014

Related U.S. Application Data

(62) Division of application No. 13/032,334, filed on Feb. 22, 2011, now abandoned.

(51) Int. Cl.
| | |
|---|---|
| *H01L 21/71* | (2006.01) |
| *H01L 21/205* | (2006.01) |
| *H01L 27/04* | (2006.01) |
| *H01L 27/20* | (2006.01) |
| *B81B 7/02* | (2006.01) |
| *B81B 7/00* | (2006.01) |

(Continued)

(52) U.S. Cl.
CPC ............ *B81B 7/008* (2013.01); *B81C 1/00246* (2013.01); *H01L 27/0611* (2013.01); *B81B 2201/0264* (2013.01); *B81B 2203/0315* (2013.01); *B81B 2207/015* (2013.01); *B81C 2203/0707* (2013.01); *B81C 2203/0735* (2013.01); *B81C 2203/0771* (2013.01)

(58) Field of Classification Search
None
See application file for complete search history.

(56) References Cited

U.S. PATENT DOCUMENTS

| | | | |
|---|---|---|---|
| 4,317,126 A * | 2/1982 | Gragg, Jr. | ...................... 257/419 |
| 4,966,663 A | 10/1990 | Mauger | |
| 5,129,981 A | 7/1992 | Wang | |

(Continued)

FOREIGN PATENT DOCUMENTS

| | | |
|---|---|---|
| CN | 101267689 A | 9/2008 |
| CN | 101479185 A | 7/2009 |

(Continued)

OTHER PUBLICATIONS

Data Sheet 2210 1 axis accelerometer downloaded from URL < http://www.silicondesigns.com/ds/ds2210.html > on Jan. 31, 2015.*

(Continued)

*Primary Examiner* — Joseph Schoenholtz
(74) *Attorney, Agent, or Firm* — Schiff Hardin LLP

(57) ABSTRACT

Embodiments relate to MEMS devices, particularly MEMS devices integrated with related electrical devices on a single wafer. Embodiments utilize a modular process flow concept as part of a MEMS-first approach, enabling use of a novel cavity sealing process. The impact and potential detrimental effects on the electrical devices by the MEMS processing are thereby reduced or eliminated. At the same time, a highly flexible solution is provided that enables implementation of a variety of measurement principles, including capacitive and piezoresistive. A variety of sensor applications can therefore be addressed with improved performance and quality while remaining cost-effective.

24 Claims, 9 Drawing Sheets

(51) Int. Cl.
   *B81C 1/00* (2006.01)
   *H01L 27/06* (2006.01)

(56) References Cited

U.S. PATENT DOCUMENTS

| | | |
|---|---|---|
| 5,167,778 A | 12/1992 | Kaneko |
| 5,332,469 A | 7/1994 | Mastrangelo |
| 5,445,718 A | 8/1995 | Wang |
| 5,501,893 A | 3/1996 | Laermer |
| 5,719,073 A | 2/1998 | Shaw |
| 5,968,336 A | 10/1999 | Rolfson |
| 6,006,607 A | 12/1999 | Bryzek |
| 6,093,330 A | 7/2000 | Chong |
| 6,122,964 A | 9/2000 | Mohaupt |
| 6,357,299 B1 | 3/2002 | Aigner |
| 6,379,990 B1 | 4/2002 | Muller |
| 6,531,068 B2 | 3/2003 | Laermer |
| 6,653,702 B2 | 11/2003 | Ishio |
| 6,662,663 B2 | 12/2003 | Chen |
| 7,288,824 B2 | 10/2007 | Partridge |
| 7,300,854 B2 | 11/2007 | Benzel |
| 7,321,156 B2 * | 1/2008 | Fischer et al. ............ 257/417 |
| 7,629,657 B2 | 12/2009 | Partridge |
| 7,833,405 B2 | 11/2010 | Benzel |
| 7,859,067 B2 | 12/2010 | Partridge |
| 8,421,169 B2 | 4/2013 | Kittilsland |
| 2002/0020053 A1 | 2/2002 | Fonash |
| 2002/0086456 A1 | 7/2002 | Cunningham |
| 2002/0086551 A1 | 7/2002 | Beetz |
| 2002/0137348 A1 | 9/2002 | Micak |
| 2002/0148807 A1 | 10/2002 | Zhao |
| 2002/0185469 A1 | 12/2002 | Podlesnik |
| 2003/0215974 A1 | 11/2003 | Kawasaki et al. |
| 2004/0067346 A1 | 4/2004 | Hofmann |
| 2005/0176198 A1 | 8/2005 | Kudelka |
| 2005/0260783 A1 * | 11/2005 | Lutz et al. .................. 438/51 |
| 2006/0231521 A1 | 10/2006 | Chilcott |
| 2006/0292877 A1 | 12/2006 | Lake |
| 2007/0072428 A1 | 3/2007 | Chilcott |
| 2007/0077727 A1 | 4/2007 | Huang |
| 2007/0170528 A1 | 7/2007 | Partridge |
| 2008/0061029 A1 | 3/2008 | Lai |
| 2008/0237756 A1 * | 10/2008 | Partridge et al. .......... 257/415 |
| 2008/0293250 A1 | 11/2008 | Dussart |
| 2009/0007681 A1 | 1/2009 | Stewart et al. |
| 2009/0309175 A1 | 12/2009 | Partridge |
| 2010/0001615 A1 | 1/2010 | Steeneken |
| 2010/0003143 A1 | 1/2010 | Toonder |
| 2010/0147070 A1 | 6/2010 | Jun |
| 2010/0313660 A1 | 12/2010 | Nishikage |
| 2011/0132872 A1 | 6/2011 | Van De Sande |
| 2011/0207323 A1 | 8/2011 | Ditizio |
| 2011/0227558 A1 | 9/2011 | Mannion |
| 2012/0126346 A1 | 5/2012 | Hoechst |
| 2012/0205753 A1 | 8/2012 | Adams |
| 2012/0235254 A1 * | 9/2012 | Mohanakrishnaswamy et al. .................. 257/415 |
| 2012/0264249 A1 | 10/2012 | Kundalgurki |
| 2015/0001665 A1 | 1/2015 | Kautzsch |

FOREIGN PATENT DOCUMENTS

| | | |
|---|---|---|
| DE | 40 00 496 A1 | 2/1991 |
| DE | 19700290 A1 | 7/1998 |
| WO | WO2007/087021 | 8/2007 |
| WO | WO 2010/052684 A2 | 5/2010 |

OTHER PUBLICATIONS

SP110 0.11 um standard cell ASIC downloaded from URL < http://www.onsemi.com/PowerSolutions/content.do?id=16649 > on Jan. 31, 2015.*
BOSCH, Research Info, *Revolution Under the Hood*, http://researchinfo.bosch.com, Issue Jan. 2003, 4 pages.
Dr. Peter Ernst, *MEMS @ BOSCH: Automotive Applications and Beyond*, Jun. 4, 2007, 9 pages.
Vigna, Benedetto, EE Times, *Making Mems: A Short Guide*, Oct. 7, 2008, 2 pages.
LPS001 WP, MEMS pressure sensor 300-1100 mbar absolute digital output barometer, Doc ID 18171, Rev. 1, Nov. 2010, pp. 1-30.
SiTime: It's About Time, *SiTime's MEMS First™ Process*, SiT-AN20001 Rev. 1.7, Feb. 17, 2009, pp. 1-6.
Rogers, T., *Selective Anodization Using Masked Deep Ion Implantation*, J. Micromech. Micreng. 3. 1993, p. 146-148.
Prime Faraday Techology Watch, ISBN 1-84402-020-7, An Introduction to MEMS, Jan. 2002, An Introduction to MEMS (Micro-electromechanical Systems).
Semiconductor Materials Prduct Guide, MEMC at p. 5 downloaded from URL http://sunedisonsilicon.com/assets/file/products/semiconductor/SunEdison_Semiconductor_Brochure.pdf, Aug. 29, 2013.
Definition of Standard downloaded from URL http:www.thefreedictionary.com/standard on Sep. 1, 2013.
Chinese Office Action, Chinese Application No. 201210038129.2, mailed Jun. 24, 2014, 8 pages.
Application and File History for U.S. Appl. No. 13/864,762, filed Apr. 17, 2013, Inventors: Behrendt et al.

* cited by examiner

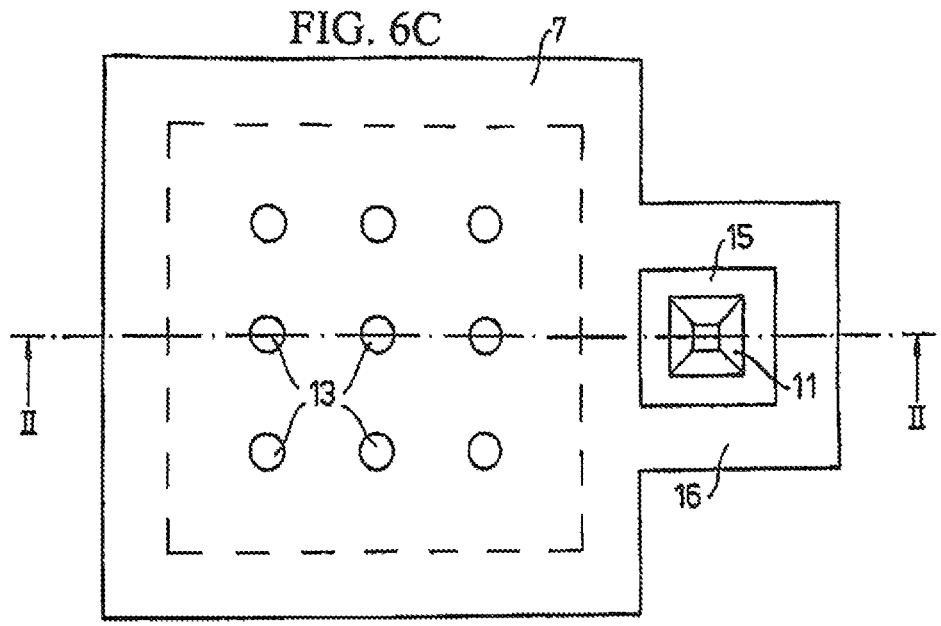
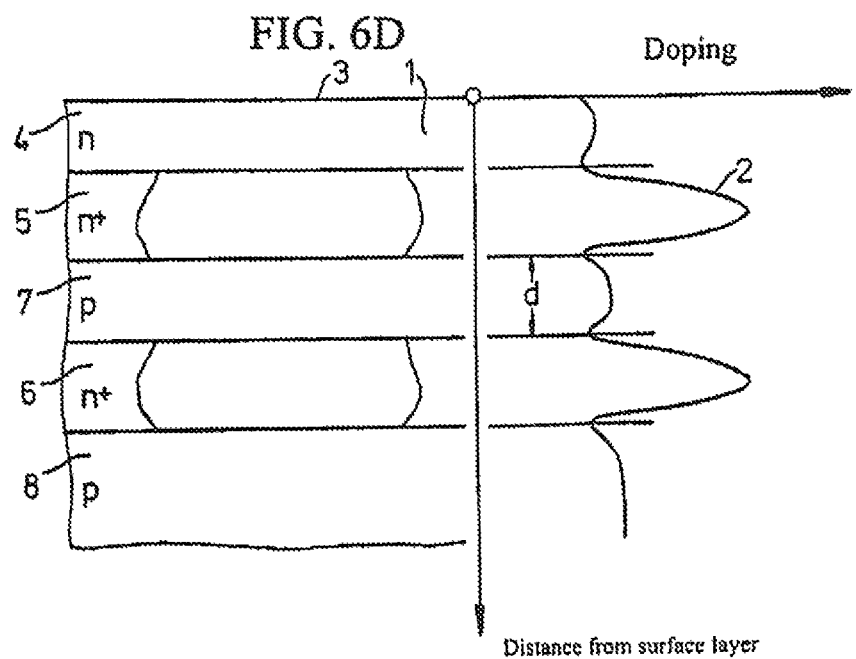

CAVITY STRUCTURES FOR MEMS DEVICES

RELATED APPLICATION

This application is a division of application Ser. No. 13/032,334 filed Feb. 22, 2011, which is hereby fully incorporated herein by reference.

TECHNICAL FIELD

The invention relates generally to microelectromechanical systems (MEMS) devices and more particularly to MEMS devices and electrical devices on a single wafer.

BACKGROUND

MEMS devices, such as sensors, and related electrical devices, such as an application-specific integrated circuit (ASIC), are typically implemented on separate chips because the fabrication processes for each are incompatible with the other. For example, in modern CMOS technologies it can be critical to avoid high temperatures in order to preserve doping profiles, whereas high temperature steps may be necessary in steps of the electrical device fabrication. There are many disadvantages associated with two-chip solutions, including more complex and expensive packaging and the inability to implement applications requiring processing of very small signals.

More recently, so-called "MEMS first" processes have been developed for integrating MEMS and electrical devices on a single chip. Such processes, however, still present drawbacks and disadvantages, leaving room for improvement.

Therefore, there is a need for improved systems and methods that enable MEMS and electrical devices to be implemented on a single wafer.

SUMMARY

Embodiments are directed to monolithic integrated MEMS sensor devices and electrical devices and method related thereto.

In an embodiment, a method of forming a monolithic integrated sensor device comprises forming a microelectromechanical system (MEMS) device on a non-silicon-on-insulator (non-SOI) substrate by: forming a monocrystalline sacrificial layer on the non-SOI substrate, depositing a first silicon layer on the monocrystalline sacrificial layer, forming a cavity in the monocrystalline sacrificial layer via at least one release aperture in the first silicon layer, and sealing the cavity by depositing a second silicon layer; and forming an electrical device on the non-SOI substrate, the electrical device comprising at least a portion of the second silicon layer.

In an embodiment, a monolithic integrated sensor device comprises a microelectromechanical system (MEMS) sensor formed on a substrate, the MEMS sensor comprising a cavity resulting from a monocrystalline sacrificial layer on a non-silicon-on-insulator (non-SOI) substrate, wherein at least one release aperture for the cavity is sealed by a silicon layer; and an electrical device comprising a portion of the silicon layer and arranged on the non-SOI substrate laterally with respect to the MEMS sensor.

In an embodiment, a method of forming a monolithic integrated sensor device comprises obtaining a non-silicon-on-insulator (non-SOI) substrate; forming an implanted layer on the non-SOI substrate; patterning a monocrystalline sacrificial layer on the implanted layer; depositing a first silicon layer on the monocrystalline sacrificial layer, the first silicon layer comprising at least one release aperture; etching the monocrystalline sacrificial layer through the release aperture to form a cavity; and sealing the cavity by depositing a second silicon layer on the first silicon layer.

BRIEF DESCRIPTION OF THE DRAWINGS

The invention may be more completely understood in consideration of the following detailed description of various embodiments of the invention in connection with the accompanying drawings, in which:

FIG. 6C shows a diagrammatic plan view of the micromechanical semiconductor arrangement.

FIG. 6D shows a diagrammatic cross section through the epitaxial layer sequence arranged on a substrate and the associated doping profile in accordance with a further exemplary embodiment.

Figure 1A:
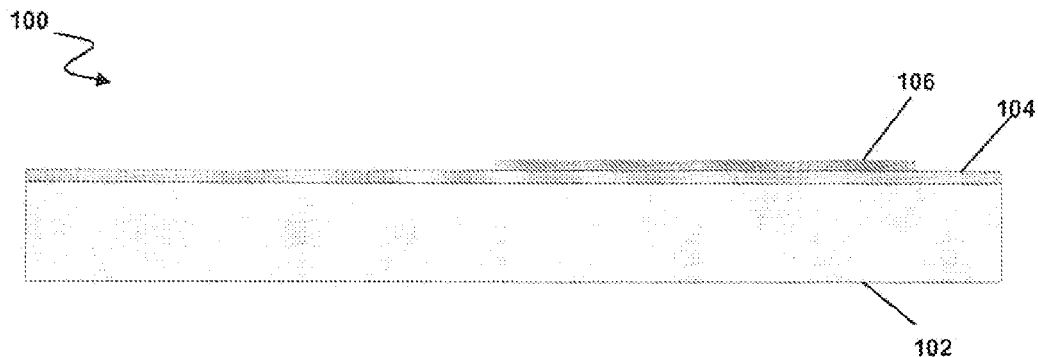
FIGS. 1A-1E depict stages in the fabrication of a capacitive MEMS device integrated with an electrical device according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to MEMS devices, particularly MEMS devices integrated with related electrical devices on a single wafer. Embodiments utilize a modular process flow concept as part of a MEMS-first approach, enabling use of a novel cavity sealing process. The impact and potential detrimental effects on the electrical devices by the MEMS processing are thereby reduced or eliminated. At the same time, a highly flexible solution is provided that enables implementation of a variety of measurement principles, including capacitive and piezoresistive. A variety of sensor applications can therefore be addressed with improved performance and quality while remaining cost-effective.

FIG. 1 depicts stages in the fabrication of a capacitive MEMS device 100 with a local sacrificial layer, such as oxide. FIG. 1A depicts a silicon substrate 102 having an implanted layer 104. In one embodiment, substrate 102 is a p-type substrate, and layer 104 is an n-type implanted layer, forming a pn-junction. A patterned sacrificial layer 106 is formed on layer 104. In one embodiment, sacrificial layer 106 comprises oxide.

Figure 1B:
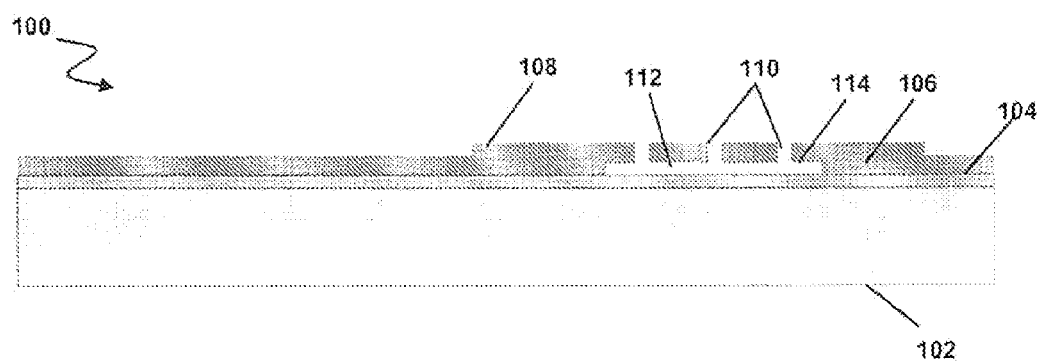

In FIG. 1B, a silicon layer 108 has been deposited, for example by epitaxial growth in an embodiment. Silicon layer 108 comprises release apertures 110 through which a cavity 112 is formed by sacrificial layer etching. In embodiments, cavity 112 is about 50 nanometers (nm) to about 100 nm high (with respect to the orientation of the drawing on the page). An optional cavity passivation layer 114, such as silicon oxide or silicon nitride, is deposited and etched back to assist with later cavity sealing.

Figure 1C:
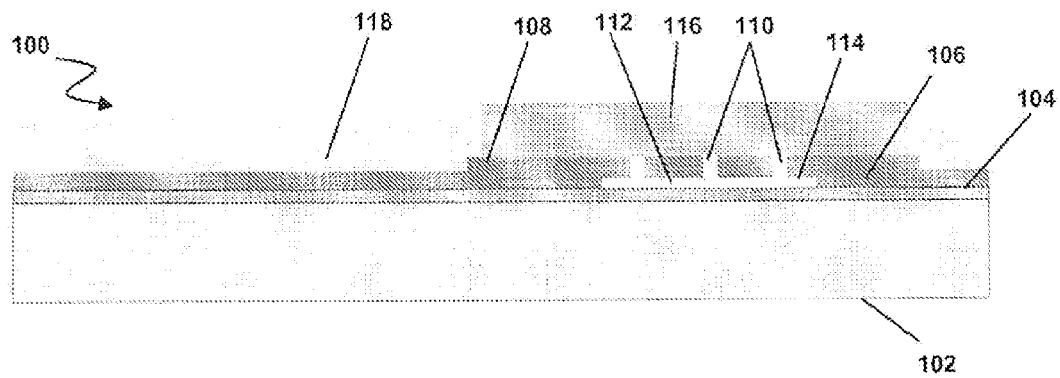

In FIG. 1C, a silicon layer 116 deposited by epitaxial growth seals cavity 112. Optional cavity passivation layer 114, if implemented in embodiments, can help to avoid silicon growth in cavity 112 under certain process conditions. As depicted in FIG. 1C, the result is a polycrystalline silicon sealed membrane 116 on top of cavity 112, with remaining sacrificial layer 108 and a monocrystalline silicon 118 on the other areas of the surface of substrate 102.

Figure 1D:
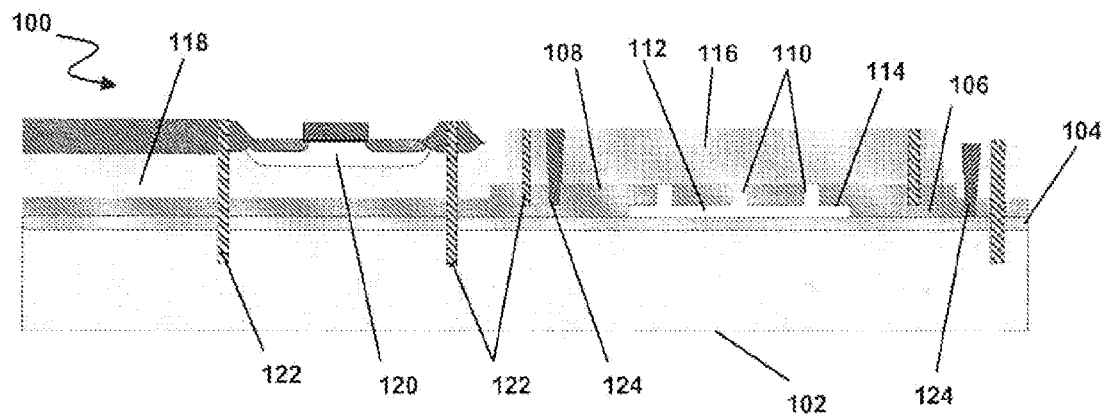

In FIG. 1D, because of the monocrystalline silicon formed next to membrane structure 116, electrical devices such as a MOS transistor 120 can be processed in common CMOS or BICMOS processes on the same wafer 102. Lateral electrical isolation can be achieved by isolation trenches 122, and electrical contact to top and bottom electrodes can be carried out by contacts structures 124.

Figure 1E:
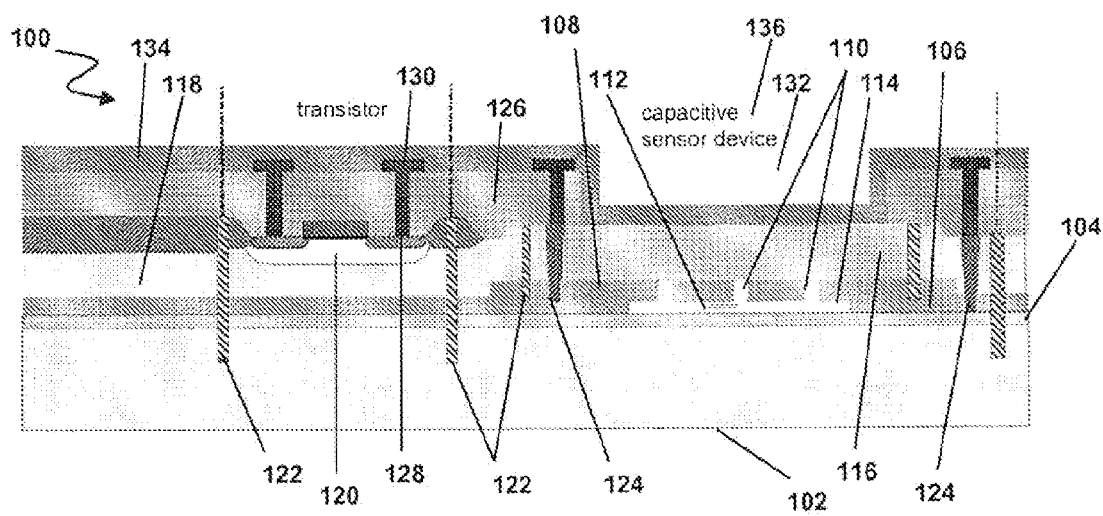

In FIG. 1E, a common wafer finishing process with inter-metal oxide 126, electrical contacts 128 and metallization 130 can be applied. After sensor release at 132 and passivation 134, a capacitive sensor device 136, such as a pressure sensor in an embodiment, is formed next to electrical devices, such as transistor 120, on the same wafer 102. In other embodiments, sensor device 136 can comprise another sensor technology, such as a piezoresistive sensor, and transistor 120 can comprise some other electrical device. While FIG. 1 is an example for monolithic integrated sensor technology, the concept also has the flexibility to create a discrete sensor device without electrical devices if necessary or desired in specific applications.

FIG. 2 depicts stages in the fabrication of a capacitive MEMS device 200 with a local monocrystalline sacrificial layer, such as silicon germanium (SiGe) or doped silicon in embodiments. In FIG. 2A, a silicon substrate 202 has an implanted layer 204. In an embodiment, substrate 202 is a p-type substrate, and layer 204 n-type, such that a vertical pn-junction is formed. A monocrystalline sacrificial layer 206 is patterned on layer 104. Sacrificial layer 206 can comprise SiGe or doped silicon with a different dopant type or doping concentration than the silicon material 204 interfacing layer 206.

Figure 2A:
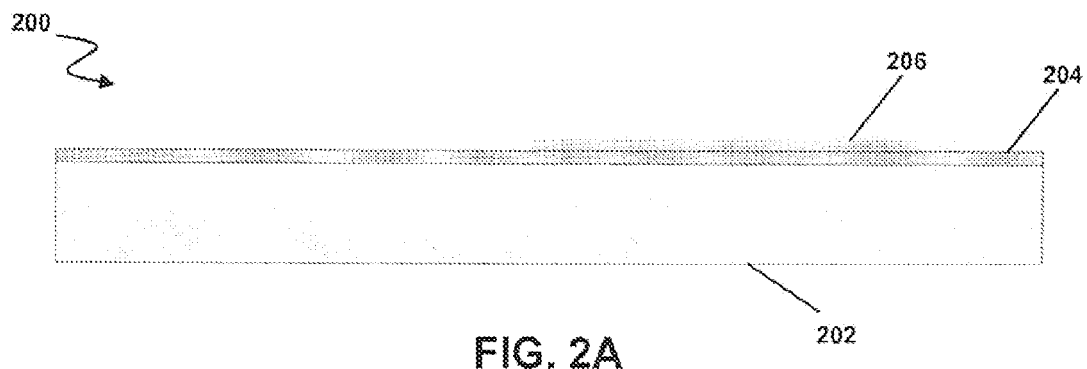
FIGS. 2A-2D depict stages in the fabrication of a capacitive MEMS device integrated with an electrical device according to an embodiment.
Figure 2B:
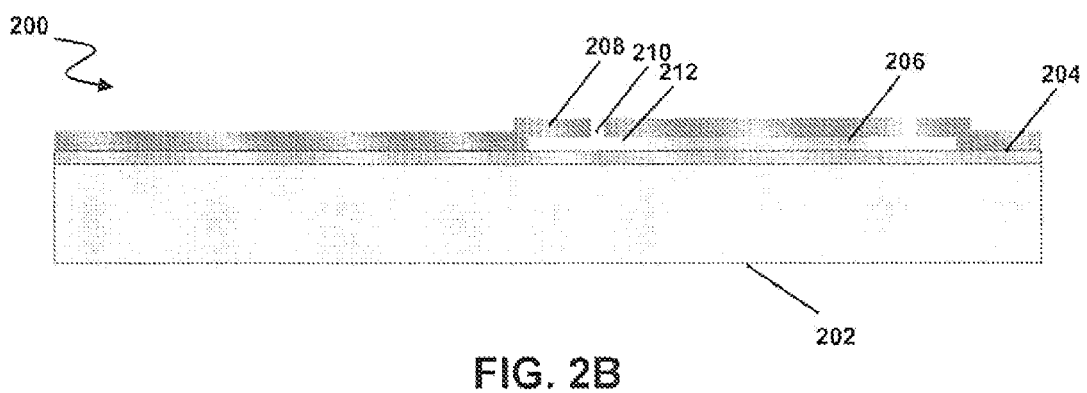
Figure 6A:
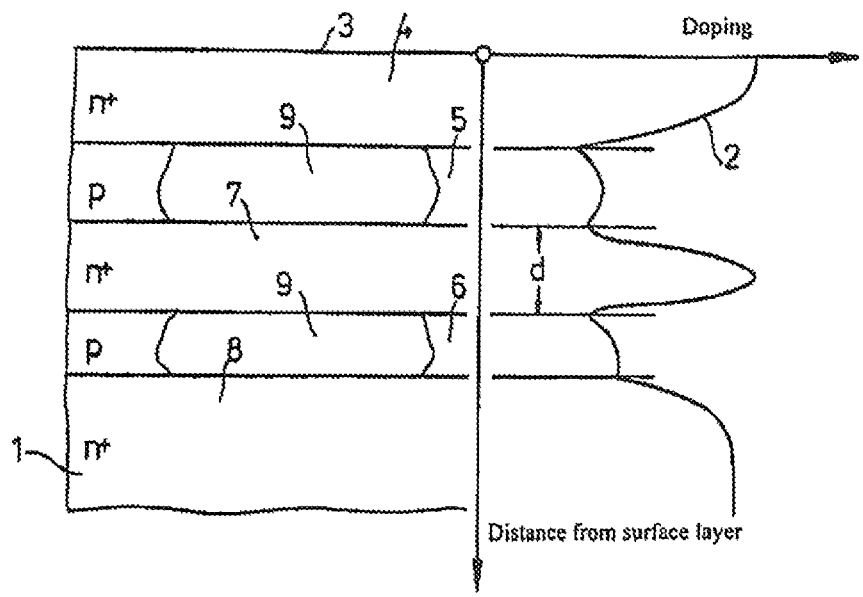
FIG. 6A shows a diagrammatic cross section through the epitaxial layer sequence arranged on a substrate and the associated doping profile.
Figure 6B:
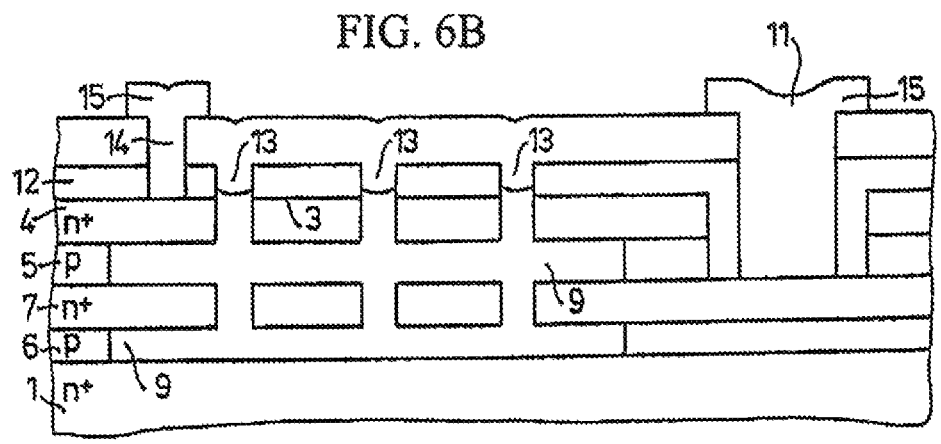
FIG. 6B shows a diagrammatic sectional view of a micromechanical semiconductor arrangement towards the end of the production method.

Referring to FIG. 2B, the monocrystalline nature of sacrificial layer 206 permits formation of a monocrystalline layer 208 by epitaxial growth next to and on top of sacrificial layer 206. Through release apertures 210, a portion of sacrificial layer 206 is removed to form cavity 212. In embodiments, cavity 212 is about 50 nm to about 100 nm high (with respect to the orientation of the drawing on the page). Embodiments of this process sequence are discussed in DE 19700290, which provides the following with reference to FIG. 6:

The production of a micromechanical semiconductor arrangement according to a preferred exemplary embodiment of the invention is explained below with reference to the diagrammatic views according to FIGS. 6A to 6C. In this case, first of all a doping profile 2 is produced in a monocrystalline semiconductor substrate 1 made, preferably of silicon by means of a corresponding number of high-energy implantation steps to be carried out. Proceeding from the layer surface 3 of the semiconductor substrate 1, a region 4 for the formation of a later covering layer is n$^+$-doped, regions 5 and 6 for the later formation of a support layer and counterbearing layer, respectively, are p-doped, a diaphragm layer 7 with a total thickness d is n$^+$-doped, and so is a remaining region 8 of the semiconductor substrate 1. It is expedient that in this case, proceeding from an n$^+$-doped semiconductor base body 8, the region 5 and the region 6 are p-doped in just two implantation steps to be carried out. In this case, a doping step also comprises a subsequent high-temperature treatment for recrystallization of the doped region and activation of the dopants. In an alternative production of the layer sequence illustrated in FIG. 3A, proceeding from an n$^+$-doped monocrystalline semiconductor base body 8, the further layers 6, 7, 5 and 4 can be applied epitaxially with the desired doping. In both cases, the result is a monocrystalline layer sequence with the doping profile illustrated in FIG. 3A, from which the thin diaphragm 7 arranged within a cavity 9 is fabricated in a later method step by means of wet-chemical etching.

In accordance with FIG. 6B, a contact hole 11 is subsequently produced, by means of phototechnology and etching steps known per se, at locations at which contact connections for electrical coupling of the diaphragm 7 are later to be produced. Afterwards, an insulation layer 12 preferably composed of silicon oxide is deposited over the whole area and etched back in order to remove the material situated on the bottom of the contact hole 11. In the next step, by means of further phototechnology, the insulation layer 12 is patterned, i.e. provided with openings 13 which are imaged onto the layers 4, 5 and 7 in a subsequent anisotropic dry etching step. These etching openings enable the penetration of the etching solution in the subsequent wet-chemical etching steps and thus, by isotropic etching of the layers 5 and 6, the formation of the cavity 9. In the case where the lightly doped regions 5 and 6 are etched, what is suitable for this purpose is, for example, a KOH etching solution which is sufficiently selective with respect to the highly doped regions 4, 7 and 1, which are not intended to be etched, or at least not appreciably so.

After the fabrication of the diaphragm 7 within the cavity 9, the holes 13 that are no longer required are covered, in the region of the covering formed from the insulation layer 12, with an oxide or borophosphorus silicate glass (BPSG) and closed off. At a suitable location, a further contact hole 14 is etched and a metallic contact 15 is led through this hole to the underlying electrically conductive layer 4. The sensor can now operate as intended as a result of the varying capacitances between the diaphragm 7 and the n$^+$-doped layer 4.

FIG. 6C illustrates a plan view of the sensor, the broken line indicating the external dimensions which are determined by the support layer 6. The counterbearing layer 5 on the one hand covers the edge region of the diaphragm 7 and on the other hand covers the extension 16—illustrated at the bottom on the right—of the diaphragm 7, the contact hole 11 also being arranged in the said extension. Arranged in the central region of the diaphragm 7 are the etching holes 13, which serves for conducting through the etching liquid for producing the cavity in the regions surrounding the diaphragm 7.

FIG. 6D shows a further embodiment of a micromechanical semiconductor arrangement according to the invention with a thin diaphragm 7 formed within a cavity, in the case of which, proceeding from a lightly p-doped silicon base body 8, an alternative doping profile with highly n⁺-doped layers 5 and 6 is formed. An etching solution which is selective with respect to the lightly p-doped layer 7 of the diaphragm and is composed of HF—HNO₃—CH₃COOH, for example, is suitable for the wet-chemical etching of the highly doped regions 5 and 6.

Figure 2C:
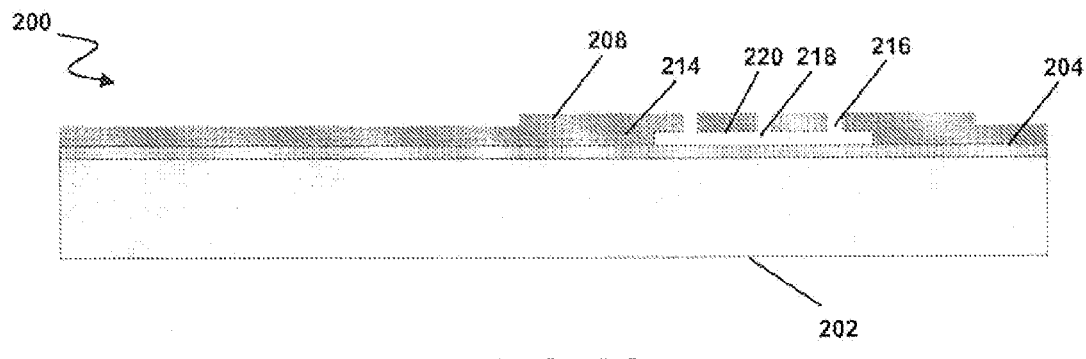

Referring to FIG. 2C, cavity 212 and release apertures 210 are filled with a filling material 214, such as oxide, for isolation and removed from the wafer surface. Through release apertures 216 formed over remaining sacrificial layer 206, a cavity 218 is formed by another sacrificial layer etch. An optional cavity passivation layer 220, such a silicon oxide or silicon nitride, is deposited and etched back on the wafer surface to assist with later cavity sealing.

Figure 2D:
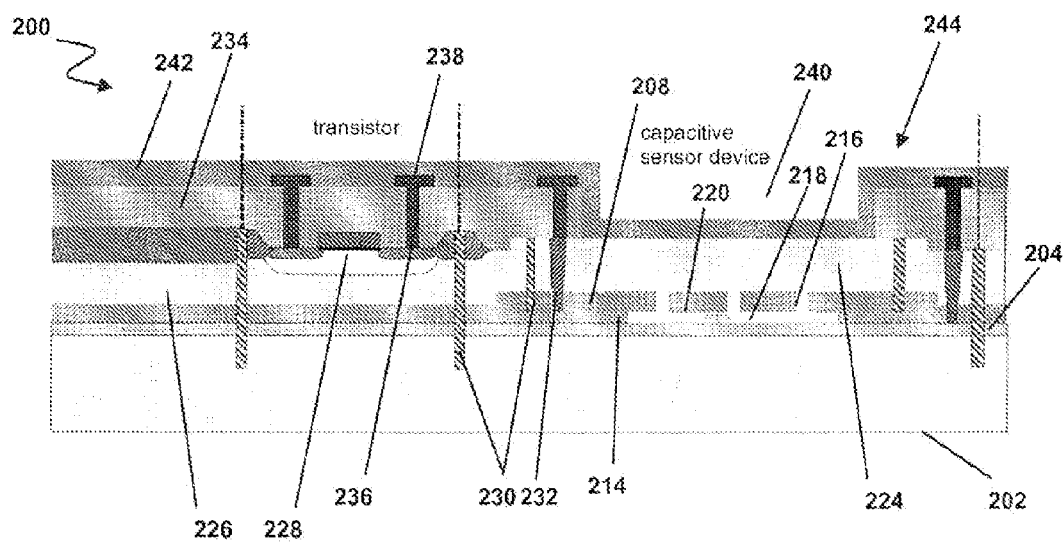

Referring to FIG. 2D, a silicon layer 222 deposited by epitaxial growth seals cavity 218. Cavity passivation layer 220 can help to avoid silicon growth inside cavity 218 under certain process conditions. The result is a monocrystalline silicon sealed membrane 224 on top of cavity 218 and a monocrystalline silicon 226 on other areas of the wafer surface.

Because of the monocrystalline silicon 226, electrical devices like a MOS transistor 228 can be formed on the same wafer 202 in common CMOS or BICMOS processes. Lateral electrical isolation can be provided by isolation trenches 230, with electrical contact to the bottom and top electrodes of the capacitive sensor device provided by contact structures 232.

A common wafer finishing process with intermetal oxide 234, electrical contacts 236 and metallization 238 can be applied. After sensor release 240 and passivation 242, a capacitive sensor device 244, such as a pressure sensor, has been formed with an electrical device, such as transistor 228, on the same wafer 202. In other embodiments, sensor device 244 can comprise another sensor technology and transistor 228 can comprise some other electrical device. While FIG. 2, like FIG. 1, is an example for monolithic integrated sensor technology, the concept also has the flexibility to create a discrete sensor device without electrical devices if necessary or desired in specific applications.

Figure 3:
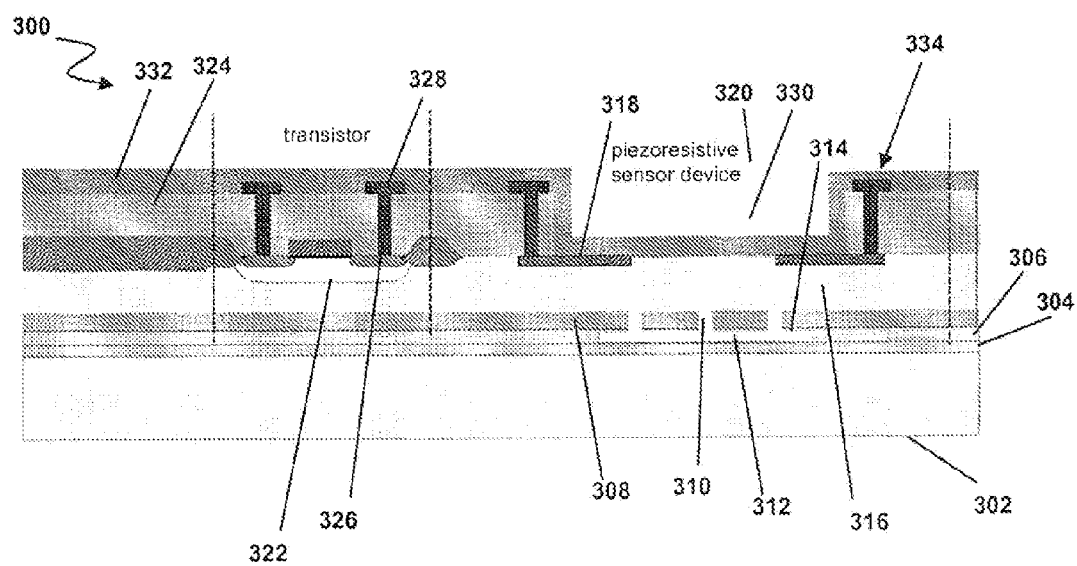
FIG. 3 depicts a piezoresistive MEMS device integrated with an electrical device according to an embodiment.

FIG. 3 depicts a piezoresistive MEMS device 300 with a monocrystalline sacrificial layer, such as silicon germanium (SiGe) or doped silicon in embodiments. In the embodiment of FIG. 3, in contrast with those of FIGS. 1 and 2, a monocrystalline sacrificial layer need not be patterned because isolation is not needed in this piezoresistive sensing embodiment as it was in the aforementioned capacitive sensing embodiments.

Device 300 comprises a silicon substrate 302 with an implanted layer 304. In an embodiment, substrate 302 is a p-type substrate, and layer 304 is an n-type implanted layer. A monocrystalline sacrificial layer 306 is formed on layer 304. Sacrificial layer 306 can comprise, for example, SiGe or doped silicon having a different dopant type and/or concentration than the silicon material at the interface of layers 304 and 306.

Monocrystalline sacrificial layer 306 enables formation of a monocrystalline layer 308 on layer 306 by epitaxial growth. Through release apertures 310, a cavity 312 can be formed by sacrificial etch, such as is described in DE19700290 discussed above. In embodiments, cavity 312 is about 50 nm to about 100 nm high (with respect to the orientation of the drawing on the page). An optional cavity passivation layer 314, such as silicon oxide or silicon nitride or some other suitable material, is deposited and etched back on the wafer surface to assist with later cavity sealing. A silicon layer 316 deposited by epitaxial growth seals cavity 312, with cavity passivation layer 314, if present, assisting to avoid silicon growth inside cavity 312 under certain process conditions. The result thus far is a monocrystalline silicon sealed membrane 316 on top of a cavity 312, with the monocrystalline silicon also on all other areas of the wafer surface. Implantation of piezoresistors 318 on monocrystalline membrane 316 provides a piezoresistive sensor device 320.

The monocrystalline silicon 316 enables electrical devices such as a MOS transistor 322 to be processed in common CMOS or BICMOS processing concepts on the same wafer 302. A common wafer finishing process with intermetal oxide 324, electrical contacts 326 and metallization 328 can be applied. After sensor release 330 and passivation 332, a piezoresistive sensor device 334, such as a pressure sensor, has been formed next an electrical device, such as a transistor 322, on the same wafer 302. In other embodiments, sensor device 334 can comprise another sensor technology and transistor 322 can comprise some other electrical device. While FIG. 3, like FIGS. 1 and 2, is an example for monolithic integrated sensor technology, the concept also has the flexibility to create a discrete sensor device without electrical devices and/or both capacitive and piezoresistive sensor devices on the same wafer if necessary or desired in specific applications.

FIG. 4 depicts stages in the fabrication of a capacitive MEMS device 400 formed on a silicon on insulator (SOI) substrate. While SOI can be more expensive than other technologies, it can provide a simplified process flow in embodiments.

Figure 4A:
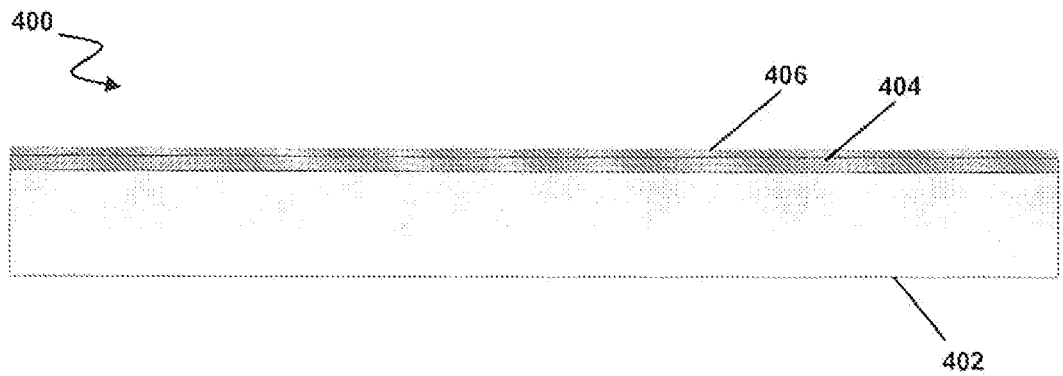
FIGS. 4A-4G depict stages in the fabrication of a capacitive MEMS device integrated with an electrical device according to an embodiment.

Referring to FIG. 4A, an SOI substrate comprises a silicon substrate 402, a box oxide layer 404 and a thin silicon device layer 406. In embodiments, layer 406 is about 100 nm to about 400 nm thick.

Figure 4B:
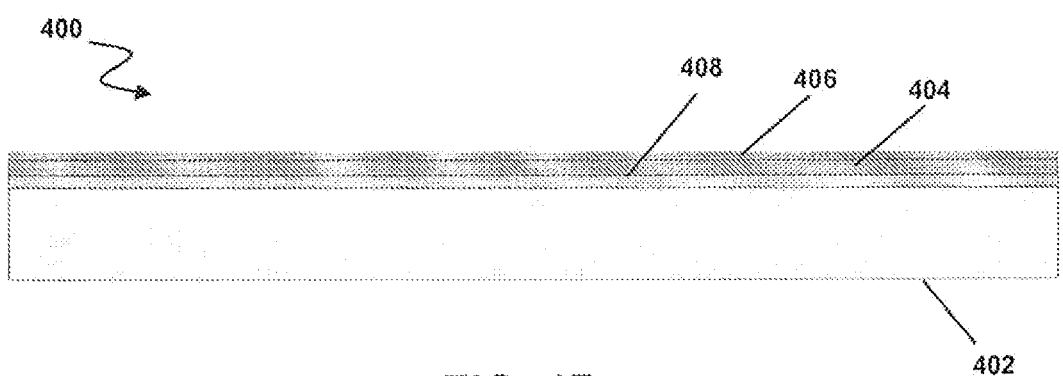

In FIG. 4B, a doped layer 408 below box oxide layer 404 is formed by high-energy implantation. Layer 408 thus can form a bottom electrode for MEMS devices.

Figure 4C:
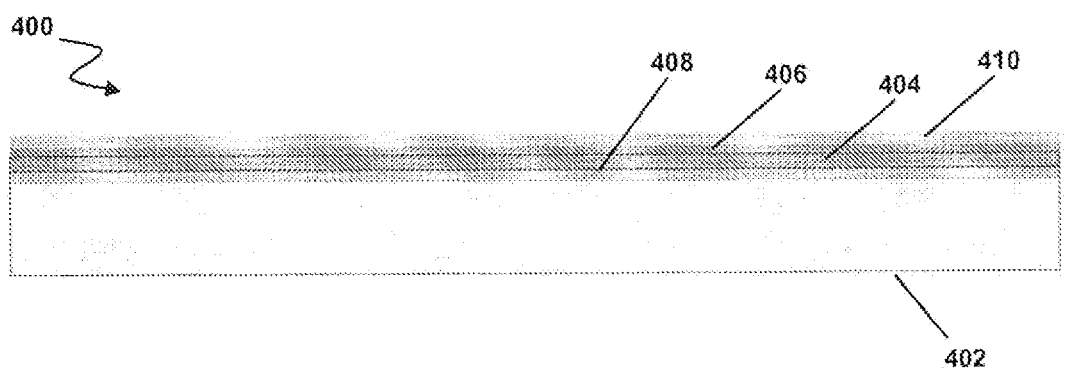

In FIG. 4C, a monocrystalline silicon layer 410 is formed by epitaxial growth.

Figure 4D:
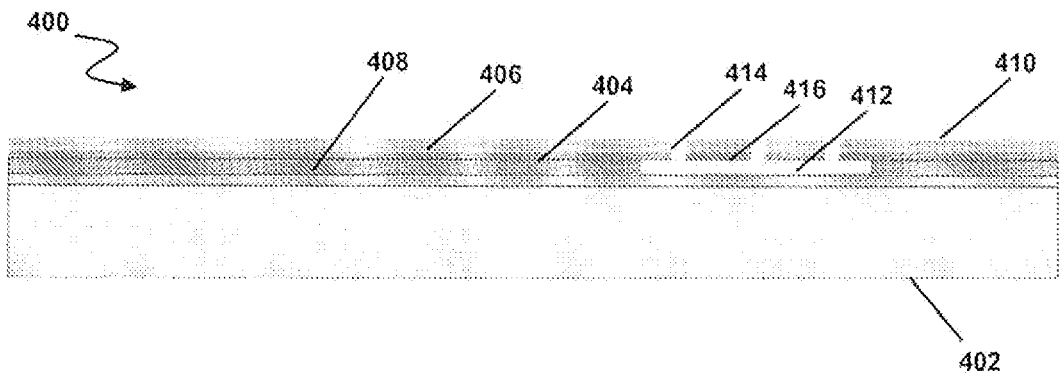

In FIG. 4D, a cavity 412 is formed by sacrificial layer etch through release apertures 414. In embodiments, cavity 412 is about 50 nm to about 100 nm high (with respect to the orientation of the drawing on the page). An optional cavity passivation layer 416, such as silicon oxide, silicon nitride or some other suitable material, is deposited and etched back on the wafer surface and can later assist with cavity sealing.

Figure 4E:
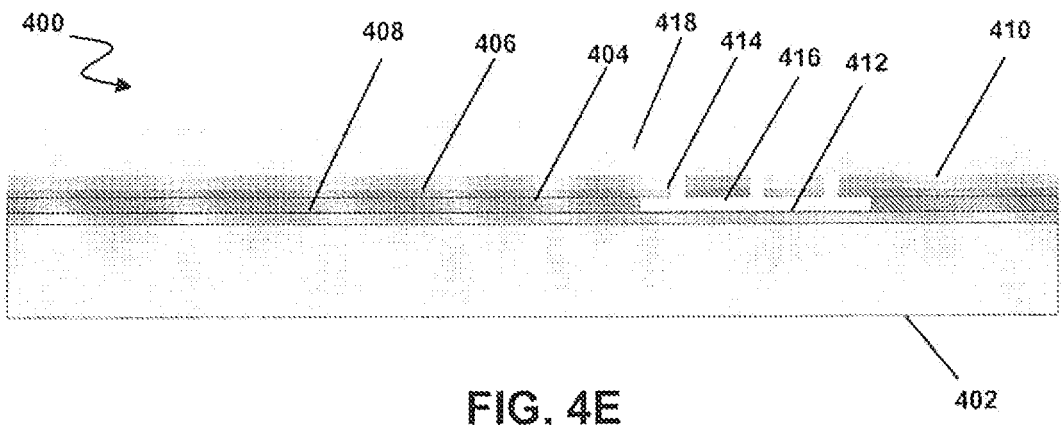

In FIG. 4E, a silicon layer 418 is deposited by epitaxial growth and seals cavity 412. Cavity passivation layer 416 can help to prevent silicon growth inside cavity 412 under certain process conditions. What results is a monocrystalline silicon sealed membrane 418 on top of cavity 412 with a monocrystalline silicon (418) also on all other areas of the wafer surface.

Figure 4F:
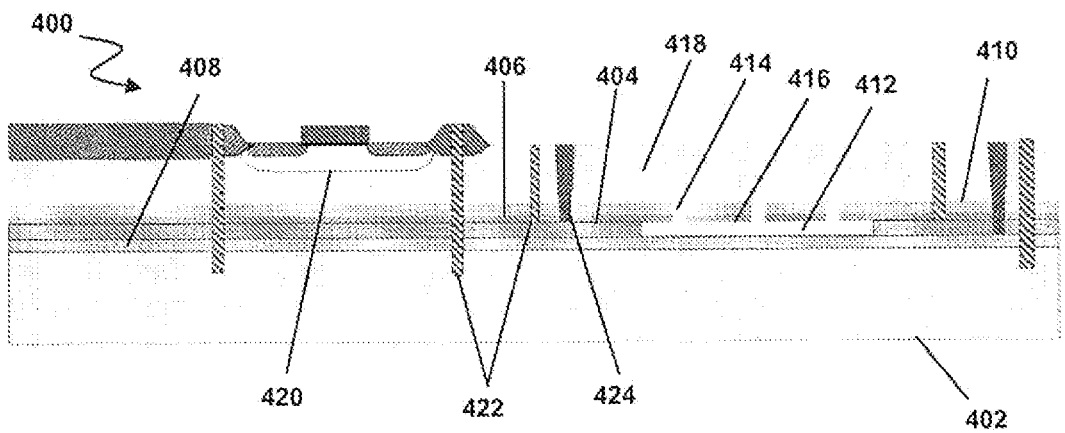

In FIG. 4F, a MOS transistor 420 or another electrical device is formed in common CMOS or BICMOS processing on the same wafer 402, enabled by the monocrystalline silicon 418. Lateral electrical isolation between the MEMS device and transistor 420 can be accomplished by isolation trenches 422. Electrical contact with the top and bottom electrodes of the sensor device can be established by contact structures 424.

Figure 4G:
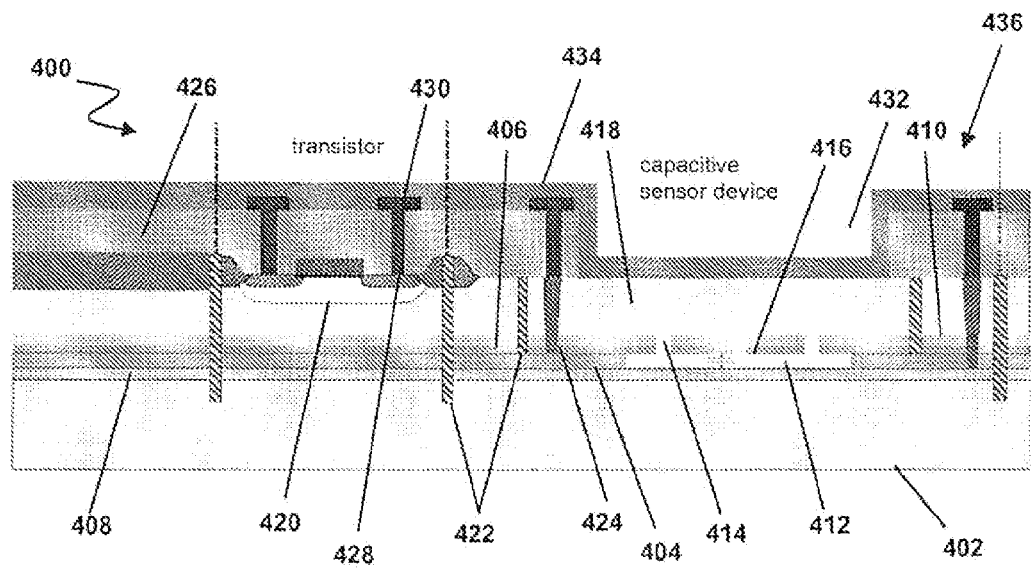

In FIG. 4G, a common wafer finishing process with intermetal oxide 426, electrical contacts 428 and metallization 430 can be applied. After sensor release 432 and passivation 434, a capacitive sensor device 436, such as a pressure sensor, is created beside and on the same wafer as electrical devices, such as transistor 420. In other embodiments, sensor device 436 can comprise another sensor technology, and transistor 420 can comprise some other electrical device. While FIG. 4, like FIGS. 1-3, is an example for monolithic integrated sensor technology, the concept also has the flexibility to create a discrete sensor device without electrical devices on the same wafer if necessary or desired in specific applications.

Figure 5:
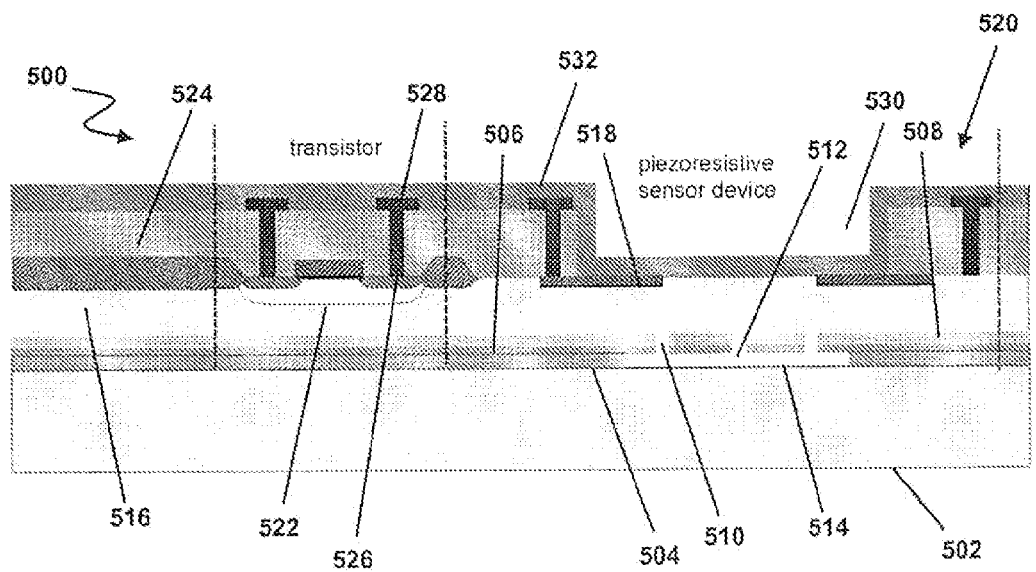
FIG. 5 depicts a piezoresistive MEMS device integrated with an electrical device according to an embodiment.

FIG. 5 depicts stages a piezoresistive MEMS device 500 formed on a SOI substrate. While SOI can be more expensive than other technologies, it can provide a simplified process flow in embodiments. An SOI substrate 502 has a box oxide layer 504 and a silicon device layer 506 formed thereon. In embodiments, layer 506 is about 100 nm to about 400 nm thick. A monocrystalline silicon layer 508 is formed on layer 504 by epitaxial growth. Through release apertures 510, a cavity 512 is formed by sacrificial layer etch. In embodiments, cavity 512 is about 50 nm to about 100 nm high (with respect to the orientation of the drawing on the page). An optional cavity passivation layer 514, such as silicon oxide, silicon nitride or some other suitable material, is deposited and etched back on the wafer surface to assist with later cavity sealing.

A silicon layer 516 is then deposited by epitaxial growth, sealing cavity 512. Cavity passivation layer 514 can help to avoid silicon growth inside cavity 512 under certain process conditions. The result is thus a monocrystalline silicon sealed membrane 516 on cavity 512, with monocrystalline silicon on all other areas of the wafer surface.

Implantation of piezoresistors 518 on the monocrystalline membrane 516 forms a piezoresistive sensor device 520.

Monocrystalline layer 516 enables electrical devices, such as a MOS transistor 522, to be processed in common CMOS or BICMOS on the same wafer 502. A common wafer finishing process with intermetal oxide 524, electrical contacts 526 and metallization 528 can be applied. After sensor release 530 and passivation 532, a piezoresistive sensor device 520, such as a pressure sensor, is formed next to an electrical device, such as transistor 522 or some other device, on the same wafer 502. In other embodiments, sensor device 520 can comprise another sensor technology, and transistor 522 can comprise some other electrical device. While FIG. 5, like FIGS. 1-4, is an example for monolithic integrated sensor technology, the concept also has the flexibility to create a discrete sensor device without electrical devices and/or both capacitive and piezoresistive sensor devices on the same wafer if necessary or desired in specific applications.

Embodiments thereby provide cost-efficient, flexible solutions for monolithic integration of MEMS structures in modern CMOS and BICMOS technologies. Negative interactions between MEMS and electrical processing steps are avoided, at least in part by utilizing a novel cavity sealing process. The smaller dimensions of the cavity that can be implemented in embodiments also improve the robustness of the device, reducing the risk of over-stress. Further, advantages in test stages of manufacturing can also be provided in embodiments by enabling use of an applied voltage rather than a physical pressure or acceleration load, thereby reducing test complexity and efforts. This is enabled at least in part by the narrower cavity. High flexibility for a variety of sensing principles, such as capacitive and piezoresistive, is provided based on the same MEMS technology platform.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention may comprise a combination of different individual features selected from different individual embodiments, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A method of forming a monolithic integrated sensor device comprising:
   forming a microelectromechanical system (MEMS) device on a non-silicon-on-insulator (non-SOI) substrate by:
      forming a monocrystalline sacrificial layer on only a first portion of the non-SOI substrate,
      depositing a first silicon layer on the monocrystalline sacrificial layer and on a second portion of the non-SOI substrate different from the first portion,
      forming a cavity in the monocrystalline sacrificial layer via at least one release aperture in the first silicon layer, and
      sealing the cavity by depositing a second silicon layer; and
   forming a transistor on the second portion of the non-SOI substrate, the transistor comprising at least a portion of the second silicon layer.

2. The method of claim 1, further comprising depositing a cavity passivation layer in the cavity.

3. The method of claim 1, wherein forming the monocrystalline sacrificial layer comprises patterning the monocrystalline sacrificial layer.

4. The method of claim 1, wherein forming the transistor further comprises utilizing the monocrystalline sacrificial layer.

5. The method of claim 1, wherein sealing the cavity further comprises depositing the second silicon layer that comprises monocrystalline silicon.

6. The method of claim 1, wherein forming a MEMS device comprises forming a sensor device.

7. The method of claim 6, wherein forming a sensor device comprises forming at least one of a capacitive sensor device or a piezoresistive sensor device.

8. The method of claim 1, wherein forming the transistor comprises utilizing one of a CMOS or BICMOS process.

9. The method of claim 1, wherein forming a MEMS device further comprises filling a portion of the cavity via at least one release aperture.

10. The method of claim 1, further comprising forming an isolation trench between the MEMS device and the transistor.

11. The method of claim 1, wherein depositing the second silicon layer comprises:
   depositing the second silicon layer on a first portion of the first silicon layer having been deposited on the monocrystalline sacrificial layer, and
   depositing the second silicon layer on a second portion of the first silicon layer having been deposited on the second portion of the non-SOI substrate.

12. The method of claim 1, wherein the monocrystalline sacrificial layer has a substantially uniform thickness.

13. The method of claim 1, wherein the second silicon layer includes a step formed between a first portion of the second silicon layer disposed on the first portion of the non-SOI substrate and a second portion of the second silicon layer disposed on the second portion of the non-SOI substrate.

14. The method of claim 13, wherein the step corresponds to an edge of the monocrystalline sacrificial layer.

15. The method of claim 1, wherein the monocrystalline sacrificial layer is the only sacrificial layer used in the formation of the MEMS device.

16. A monolithic integrated sensor device comprising:
   a microelectromechanical system (MEMS) sensor formed on a first portion of a non-silicon-on-insulator (non-SOI) substrate, the MEMS sensor comprising:
      a monocrystalline sacrificial layer deposited on only the first portion of the non-SOI substrate,
      a cavity formed in the monocrystalline sacrificial layer and having an aperture, and
      a silicon layer deposited on the monocrystalline sacrificial layer and a second portion of the non-SOI substrate, wherein the silicon layer seals the aperture; and
   a transistor arranged laterally with respect to the MEMS sensor and comprising a portion of the silicon layer formed on the second portion of the non-SOI substrate.

17. The device of claim 16, wherein the silicon layer comprises a monocrystalline silicon layer.

18. The device of claim 16, further comprising an isolation trench formed between the MEMS sensor and the transistor.

19. The device of claim 16, wherein the MEMS sensor is one of a capacitive sensor or a piezoresistive sensor.

20. The device of claim 16, further comprising a cavity passivation layer inside the cavity.

21. The device of claim 16, wherein the silicon layer comprises a membrane.

22. A method of forming a monolithic integrated sensor device comprising:
   obtaining a non-silicon-on-insulator (non-SOI) substrate having a first and second portions;
   forming an implanted layer on the first and second portions of the non-SOI substrate;
   patterning a monocrystalline sacrificial layer on only a first portion of the implanted layer having been formed on the corresponding first portion of the non-SOI substrate;
   depositing a first silicon layer on the monocrystalline sacrificial layer and a second portion of the implanted layer formed on the second portion of the non-SOI substrate, the first silicon layer comprising at least one release aperture;
   etching the monocrystalline sacrificial layer through the release aperture to form a cavity;
   sealing the cavity by depositing a second silicon layer on the first silicon layer; and
   forming a monolithic integrated sensor device by forming a transistor on the second portion of non-SOI substrate utilizing the second silicon layer.

23. The method of claim 22, further comprising forming a microelectromechanical system (MEMS) sensor by carrying out the obtaining, forming, patterning, depositing, etching and sealing.

24. The method of claim 22, wherein forming a MEMS sensor further comprises forming at least one of a capacitive MEMS sensor or a piezoresistive MEMS sensor.

* * * * *